United States Patent [19]

Dawe et al.

[11] 3,852,682

[45] Dec. 3, 1974

[54] OSCILLATION GENERATORS

[75] Inventors: Christopher Dawe, St. Albans; John David Middleton, Welwyn, both of England

[73] Assignee: Marconi Instruments Limited, Chelmsford, Essex, England

[22] Filed: June 22, 1973

[21] Appl. No.: 372,626

[30] Foreign Application Priority Data

June 22, 1972 Great Britain .................... 29226/72

[52] U.S. Cl. ........................................ 331/4, 331/12

[51] Int. Cl. ............................................... H03b 3/04

[58] Field of Search ............................. 331/4, 11, 12

[56] References Cited

UNITED STATES PATENTS 3,021,491 2/1962 Orenberg ................................ 331/4

3,101,448 8/1963 Costas .................................. 331/12

3,421,105 1/1969 Taylor .................................... 331/4

*Primary Examiner*—John Kominski

*Attorney, Agent, or Firm*—Baldwin, Wight & Brown

[57] ABSTRACT

An oscillation generator in which a tunable oscillator is locked onto the sum of or difference between a reference frequency and an off-set frequency by comparing the oscillator output first with the reference and then comparing the result of the first comparison with the off-set frequency and in which the result of the first comparison is compared with the off-set frequency phase shifted by 90° the result of this last comparison being used to prevent the oscillator from locking onto the sum when the difference is required or vice-versa.

4 Claims, 3 Drawing Figures

OSCILLATION GENERATORS

This invention relates to oscillation generators and more particularly to oscillation generators of the kind in which a voltage tunable oscillator is caused to be automatically tuned to the sum or difference of or between a reference frequency and a variable so-called off-set frequency, smaller than the reference frequency, by comparing the oscillator frequency with the reference frequency in a first phase comparator, comparing the resultant of this comparison with the variable off-set frequency in a second phase comparator and using the resultant of the second comparison to cause the voltage tunable oscillator to be swept in frequency until it locks in in-phase relationship with the aforesaid sum or difference frequency. Such oscillation generators are of wide application, notably in instruments for testing and measuring the performance of radio, electronic high frequency communication and like apparatus.

Figure 2:
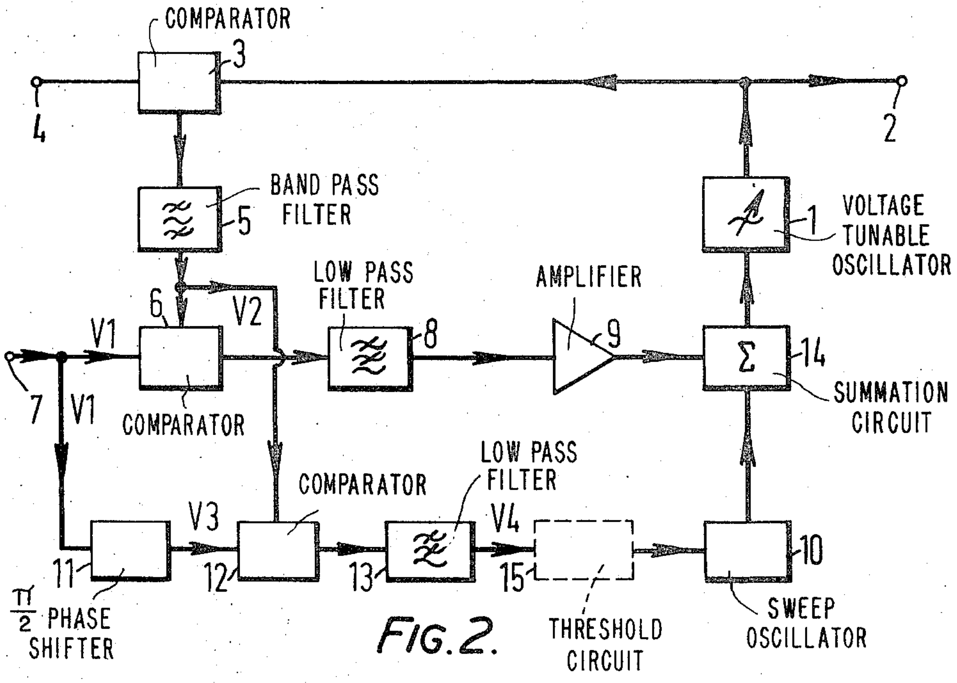
Figure 3:
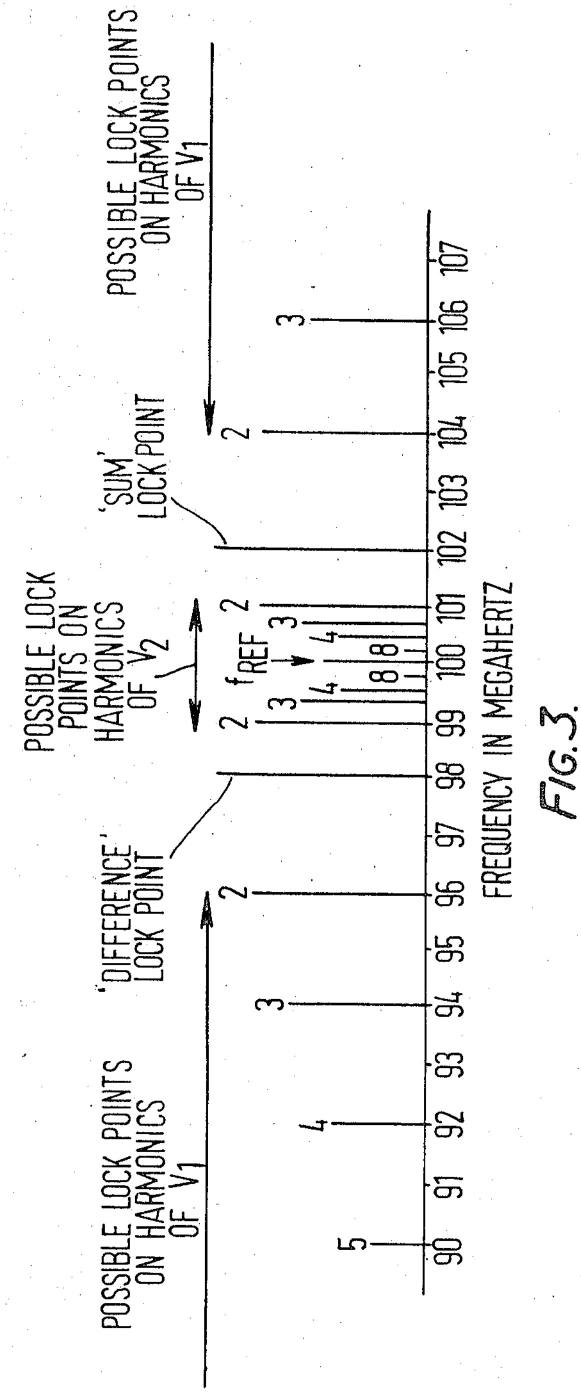

The invention is illustrated in and explained in connection with the accompanying drawings in which FIG. 1, which is provided for purpose of explanation, is a block diagram of a typical known oscillation generator of the kind referred to;

FIG. 2 is a block diagram which is used to explain two embodiments of this invention, and FIG. 3 is an explanatory frequency diagram of the spectral type.

In describing the figures typical practical values of frequency will be mentioned but it is to be understood that these are by way of example only.

Figure 1:
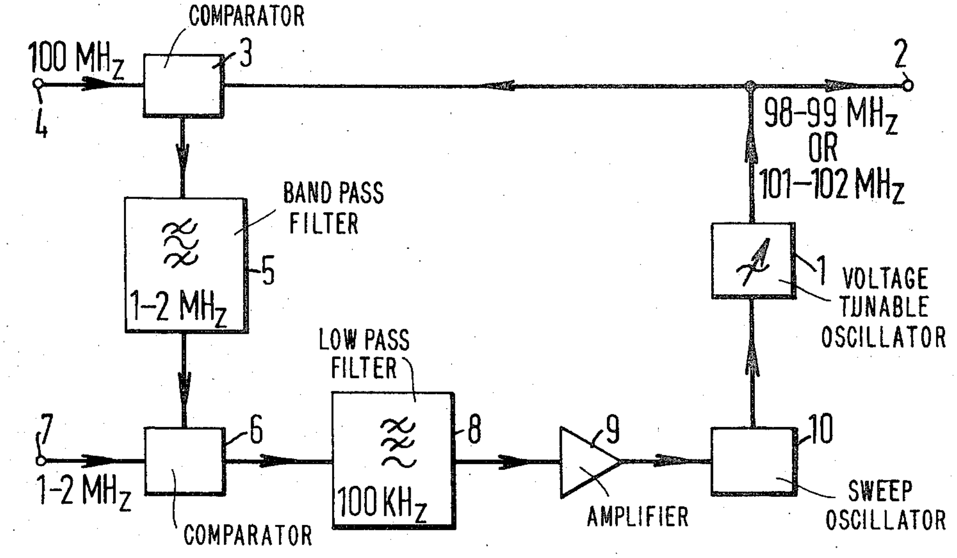
FIG. 1. PRIOR ART

Referring to FIG. 1 the block 1 represents a voltage tunable oscillator, normally an oscillator including a tuning element in the form of a varactor diode included in its frequency determining circuit. Output from this oscillator is taken off for utilisation at an output terminal 2 and is also fed back to constitute one input to a phase detector or comparator 3 the second input to which is a reference frequency, in the present example of 100 MHz, applied at terminal 4 from a reference oscillator (not shown) — normally a crystal oscillator. The resultant of comparison is fed through a bandpass filter 5 passing (in this example) 1 – 2 MHz, to one input of a second phase comparator 6, the second input to which is constituted by a variable off-set frequency (in this example, variable over the range 1 – 2 MHz) applied at terminal 7 from a variable frequency oscillator (not shown). The output from comparator 6 is fed through a low pass filter 8 passing (in this example) frequencies below 100 KHz to an amplifier 9 and hence to a search oscillator 10 operating at, say, 10 Hz, which sweeps the tunable oscillator until it locks in phase at the sum of or difference between the reference frequency and the off-set frequency.

The known generator shown in FIG. 1 is satisfactory if the separation of the sum and difference frequencies is large compared with the drift and tolerances of the tunable oscillator 1. When this is not the case, however, there is ambiguity as to whether locking in will occur on the sum frequency or the difference frequency and either range (98–99 MHz or 101 – 102 MHz) may be produced as determined by random switching or like transients which may cause the said oscillator to approach the locking frequency from above or below. This is a serious defect which it is the object of the present invention to overcome.

According to this invention an oscillation generator comprises a voltage tunable oscillator, first phase comparison means for comparing the frequency generated thereby with a reference frequency; second phase comparison means for comparing output from said first phase comparison means with a relatively low off-set frequency; and means for varying the tuning of said tunable oscillator to cause it to lock in to a frequency equal to the sum or to the difference (whichever of these two may be the desired frequency) of or between said reference frequency and said off-set frequency, the last mentioned means including means for continuing variation of tuning of said tunable oscillator until a phase quadrature relation of pre-determined sense exists between said off-set frequency and the output of said first phase comparison means.

An oscillation generator in accordance with the invention may comprise a voltage tunable oscillator; a first phase comparator connected to compare output from said oscillator with a reference frequency; a second phase comparator connected to compare output from said first comparator with an off-set frequency; a third phase comparator having two input channels one fed from the first phase comparator and the other fed with the off-set frequency, one of said input channels having a phase shift of 90° relative to that of the other; a sweep or search oscillator; means for stopping said sweep oscillator sweeping if, and only if, the output of said third comparator is of a predetermined sign; means for combining output from said sweep oscillator with output derived from said second comparator; and means for utilising output from said combining means to control the tuning of said tunable oscillator.

Conveniently a 90° phase shifter may be included in the input channel through which the off-set frequency is supplied to the third comparator.

Preferably a threshold circuit is interposed in a channel between the third comparator and the sweep oscillator to prevent the passage of signals of less than a predetermined threshold magnitude.

Preferably a band pass filter is interposed in the path between the first and second comparators and low pass filters are interposed in the paths between the second comparator and the combining means and between the third comparator and the sweep oscillator.

FIG. 2 serves to illustrate two embodiments of the invention, one being a modification of the other. For one embodiment this figure should be regarded as though the broken line block were not present, the two blocks between which it is shown being in direct connection. For the modified embodiment the figure should be read as drawn. The former embodiment (broken line block absent) will first be described.

The references 1 to 9 inclusive in FIG. 2 refer to the same parts as the corresponding references in FIG. 1. In FIG. 2 the two inputs to the phase comparator 6 are designated V1 and V2, the former being the off-set frequency input from terminal 7 and the latter being the input from the comparator 3 after filtering by the filter 5. It will be seen that, in the phase locked condition V1 and V2 will be in phase quadrature, V1 leading or lagging on V2 in dependence upon whether the feed back loop has locked on the sum or difference frequency. If one of these signals is subjected to a further 90° phase shift a phase opposition situation will be set up. In the particular embodiment illustrated by FIG. 2, V1 is shifted by 90° by a phase shifter 11, producing an output signal, designated V3, which in the phase locked condition is in phase or in phase opposition to V2. Signals V2 and V3 are applied respectively to the two inputs of a further phase comparator 12 the output from which is filtered by a low pass filter 13. It will be at once apparent that the output designated V4, from the filter 13 will be of one sign if phase locking has occurred on the sum frequency and of the opposite sign if it has occurred on the difference frequency: thus if the sum frequency is required, the filtered output from 13 may be arranged to be positive in which case said output will be negative if phase locking occurs on the difference frequency. The output from 13 is employed to control the search oscillator 10.

In FIG. 2 the search oscillator 10 is not connected (as in FIG. 1) to the amplifier 9 but (ignoring for the moment the broken line block) to the output of the filter 13 and the outputs of said search oscillator 10 and of the amplifier 9 are combined in a summation circuit 14, the combination output from which controls the tuning of the tunable oscillator 1.

When an oscillation generator as shown in FIG. 2 and as above described is switched on, the search oscillator 10 may cause the tunable oscillator 1 first to sweep to the unwanted frequency (assumed above to be the difference frequency) and thus cause the output signal V4, from the filter 13 to be negative. The arrangement is such that, in this condition — V4 negative — the search oscillator 10 continues to search, continuing to unbalance the loop because of the signal it contributes to the summation circuit 14 until the "hold" frequency range is exceeded and phase lock is lost. Eventually the search oscillator, in continuing its searching, will cause the tunable oscillator 1 to lock on the desired (assumed sum) frequency. In this condition V4 is positive and the arrangement is such that, in this condition, the search oscillator 10 is caused to stop searching, thus leaving the oscillator 1 locked in on the desired frequency.

In a modification of the embodiment above described, means are provided for ensuring that the tunable oscillator cannot lock in at undesired other lock positions due to harmonics of either V1 or V2 or both. FIG. 3 is a spectral diagram showing theoretically possible lock modes for a case where the frequencies have the values given in connection with FIG. 1, the reference frequency being assumed to be 100 MHz and the off-set frequency to be 2 MHz. As will be apparent from FIG. 3 there are many possible lock positions due to harmonics of V1 or V2 but, in any practical embodiment, these will be at least 10dB down as compared with lock positions due to the fundamental frequencies. Accordingly by providing a threshold circuit for V4 it can be ensured that the search oscillator 10 will be stopped only by a positive value of V4 above the threshold value. Such a threshold circuit is represented by the broken line block 15 in FIG. 2. Taking the example of 10dB mentioned above, V4 might be (to quote practical figures) +1V for the wanted signal, +0.32V for the second harmonic, +0.1V for the third harmonic . . . and still lower values for still higher harmonics. In such a case, by setting the threshold circuit 15 to respond only to signals exceeding +0.5V all false locks due to harmonics would be eliminated.

We claim:

1. An oscillation generator including a voltage tunable oscillator; a first phase comparator connected to compare output from said oscillator with a reference frequency; a second phase comparator connected to compare output from said first comparator with an off-set frequency; a third phase comparator having two input channels one fed from the first phase comparator and the other fed with the off-set frequency, one of said input channels having a phase shift of 90° relative to that of the other; a sweep or search oscillator; means for stopping said sweep oscillator sweeping if, and only if, the output of said third comparator is of a predetermined sign; means for combining output from said sweep oscillator with output derived from said second comparator; and means for utilising output from said combining means to control the tuning of said tunable oscillator.

2. An oscillation generator according to claim 1 wherein a 90° phase shifter is included in the input channel through which the off-set frequency is supplied to the third comparator.

3. An oscillation generator according to claim 1 wherein a threshold circuit is interposed in a channel between the third comparator and the sweep oscillator to prevent the passage of signals of less than a predetermined threshold magnitude.

4. An oscillation generator according to claim 1 wherein a band pass filter is interposed in the path between the first and second comparators and low pass filters are interposed in the paths between the second comparator and the combining means and between the third comparator and the sweep oscillator.

* * * * *